(12) United States Patent
Obi et al.

(10) Patent No.: US 7,191,082 B2
(45) Date of Patent: Mar. 13, 2007

(54) METHOD OF INSPECTING SUBSTRATE PROCESSING APPARATUS, AND STORAGE MEDIUM STORING INSPECTION PROGRAM FOR EXECUTING THE METHOD

(75) Inventors: Akira Obi, Nirasaki (JP); Hiroshi Nakamura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/329,078

(22) Filed: Jan. 11, 2006

(65) Prior Publication Data
US 2006/0160256 A1    Jul. 20, 2006

Related U.S. Application Data

(60) Provisional application No. 60/649,084, filed on Feb. 3, 2005.

(30) Foreign Application Priority Data
Jan. 19, 2005    (JP)    ............................. 2005-011951

(51) Int. Cl.
*G06F 11/30*    (2006.01)
*H01L 21/00*    (2006.01)
(52) U.S. Cl. .......................................... 702/81; 438/14

(58) Field of Classification Search .................. 702/81
See application file for complete search history.

(56) References Cited

U.S. PATENT DOCUMENTS

| 6,954,716 B2 * | 10/2005 | Tanaka et al. ............... 702/184 |
| 2003/0182084 A1 | 9/2003 | Tanaka et al. ............... 702/184 |
| 2006/0181699 A1 * | 8/2006 | Numakura ............... 356/237.2 |

FOREIGN PATENT DOCUMENTS

JP    2002-25878    1/2002

* cited by examiner

*Primary Examiner*—John Barlow
*Assistant Examiner*—Cindy D. Khuu
(74) *Attorney, Agent, or Firm*—Oblon, Spivak, McClelland, Maier & Neustadt, P.C.

(57) ABSTRACT

A method of inspecting a substrate processing apparatus that enables a reduction in operator labor time to be achieved. A host computer instructs a substrate processing apparatus to prohibit transfer of a product wafer into the substrate processing apparatus during a period of cleaning the substrate processing apparatus. The substrate processing apparatus notifies the host computer of a number and types of inspection wafers to be used in inspections for predetermined inspection items. The host computer notifies the substrate processing apparatus that preparation of the inspection wafers has been completed.

9 Claims, 8 Drawing Sheets

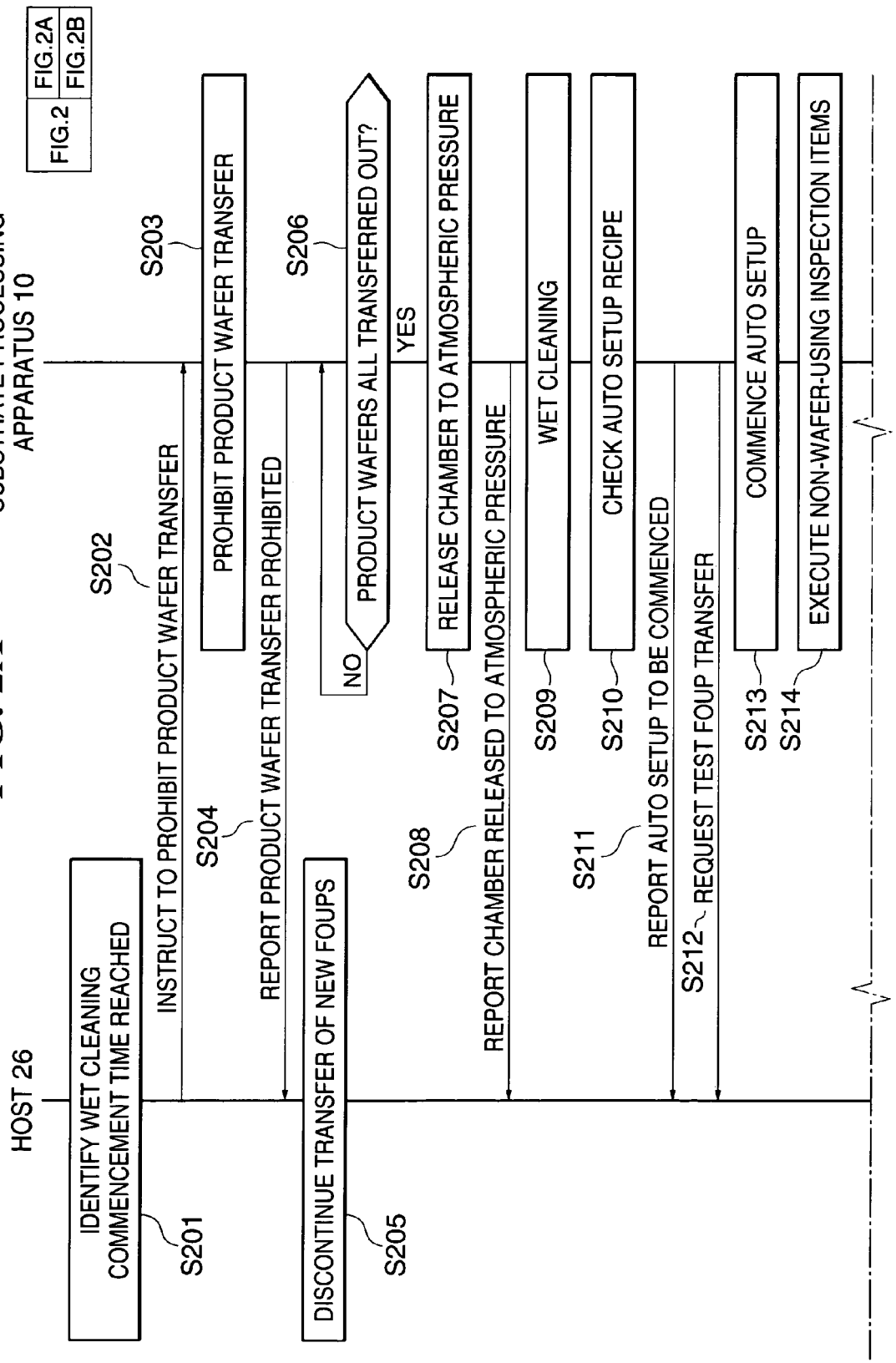

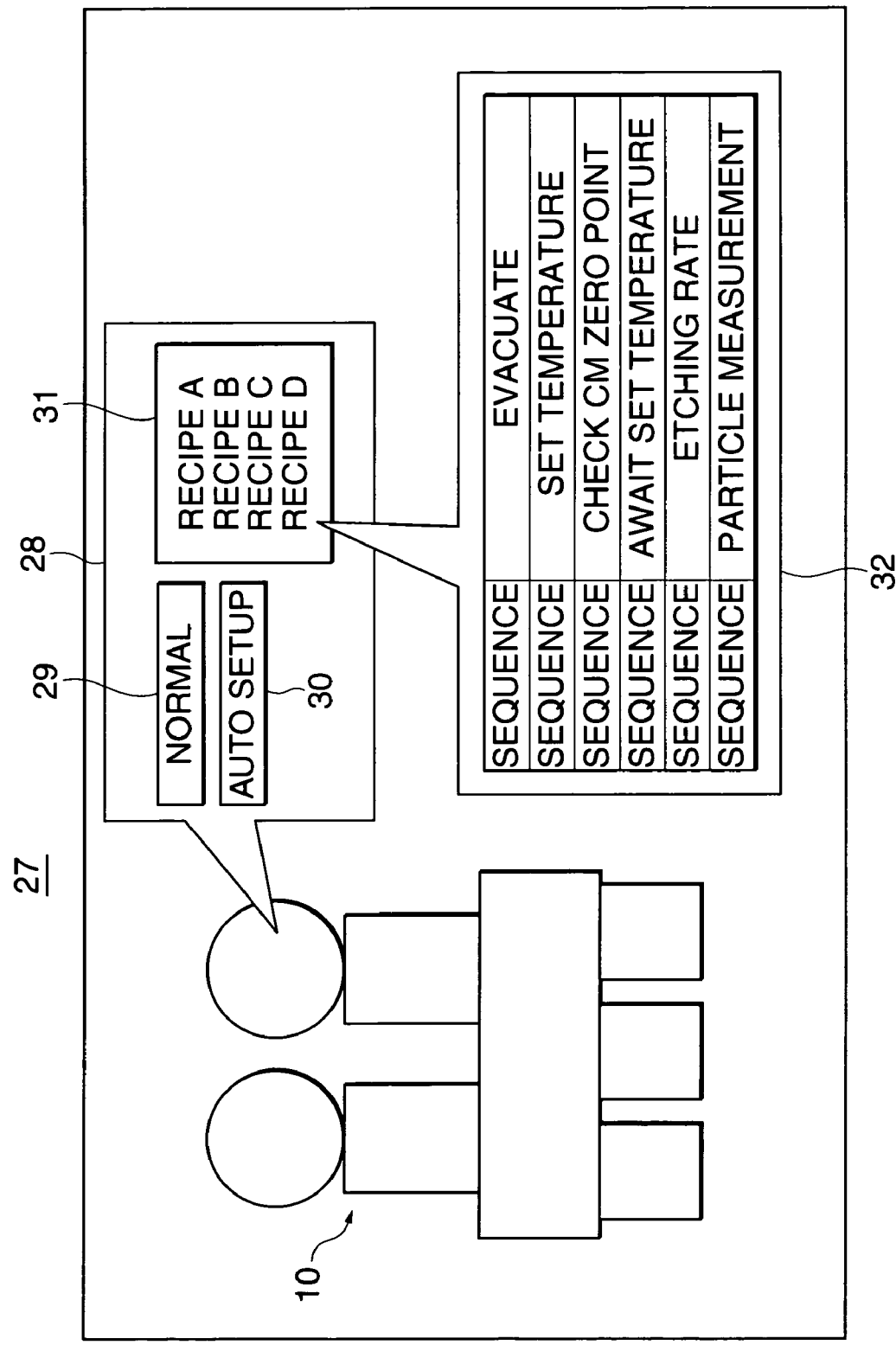

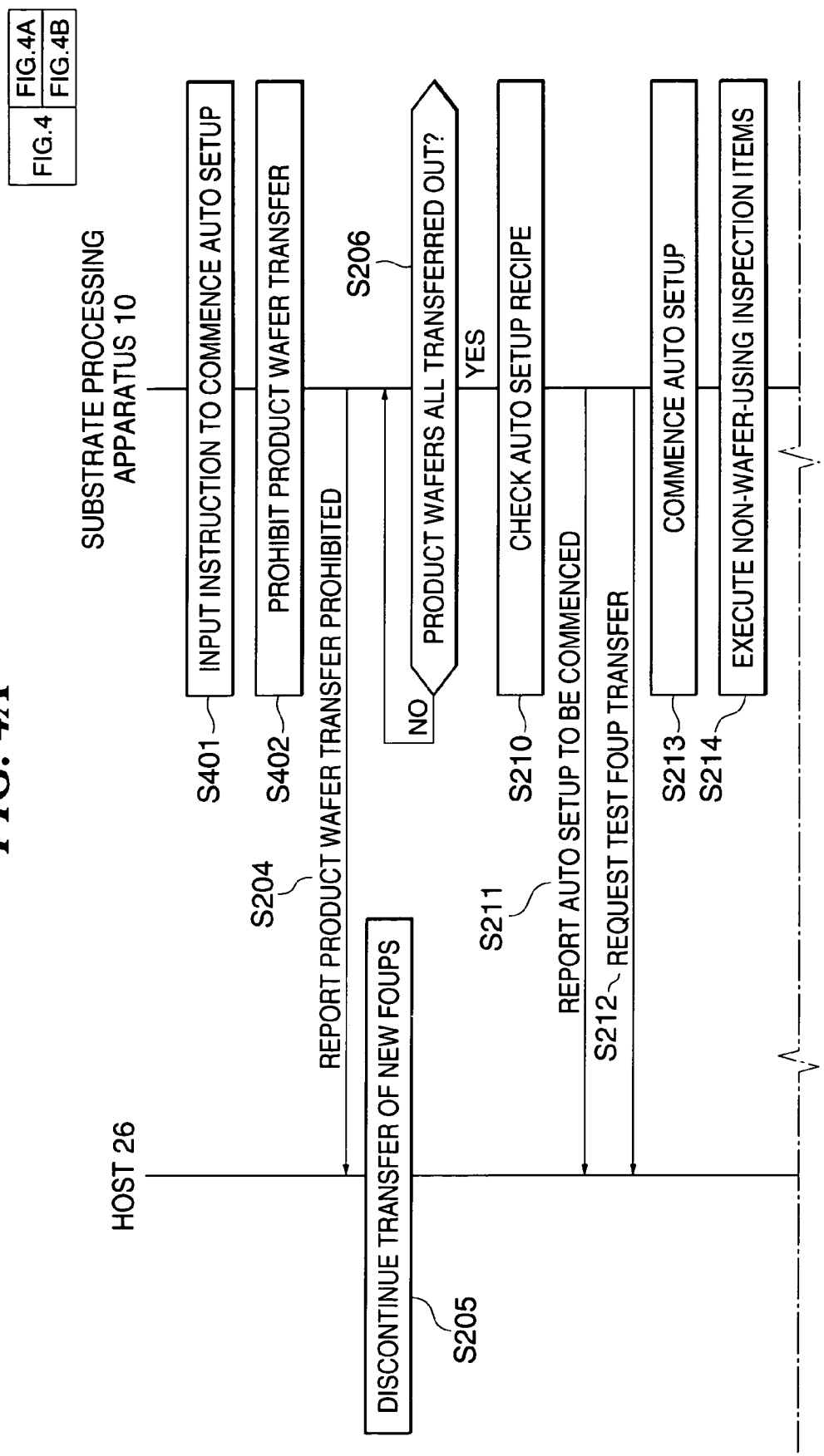

METHOD OF INSPECTING SUBSTRATE PROCESSING APPARATUS, AND STORAGE MEDIUM STORING INSPECTION PROGRAM FOR EXECUTING THE METHOD

BACKGROUND OF THE INVENTION

1. Field of the Invention

The present invention relates to a method of inspecting a substrate processing apparatus, and a storage medium storing an inspection program for executing the method, and more particularly to a method of inspecting a substrate processing apparatus that communicates with a host computer.

2. Description of the Related Art

Conventionally, a semiconductor device manufacturing plant has provided therein a substrate processing apparatus that carries out etching on product wafers for semiconductor device manufacture, and a wafer supplying apparatus that supplies FOUPs (front opening unified pods), which are containers each housing a plurality of the product wafers, to the substrate processing apparatus. Moreover, such a plant also has provided therein a host computer (hereinafter merely referred to as the "host") that controls operations of the substrate processing apparatus and the wafer supplying apparatus. The host coordinates operations between the substrate processing apparatus and the wafer supplying apparatus during semiconductor device manufacture.

The substrate processing apparatus is comprised of processing chambers (vacuum processing chambers), load lock chambers as transfer chambers each of which is connected to a corresponding one of the processing chambers, FOUP mounting stages on which FOUPs are mounted, and a loader unit as a transfer chamber that is disposed between the load lock chambers and the FOUP mounting stages. The substrate processing apparatus communicates with the host via a communication cable. Moreover, the wafer supplying apparatus is a mobile robot on which a FOUP can be mounted. The wafer supplying apparatus communicates with the host by wireless communication.

As the time elapses during operation of the substrate processing apparatus, particles become attached to the interior of each of the processing chambers, and due to the attached particles, the product wafer etching rate changes, or the amount of particles attached to the product wafers increases. After a predetermined operating time has elapsed, it is thus necessary to open a lid of the processing chamber, and clean the interior of the processing chamber by, for example, wet cleaning with alcohol.

In view of this, the host carries out management of the operating time of the substrate processing apparatus, and once a predetermined operating time has elapsed, issues an instruction to the substrate processing apparatus to shift into a maintenance mode for cleaning the interior of the processing chamber. Once the substrate processing apparatus has been shifted into the maintenance mode, cleaning of the interior of the processing chamber is carried out, and then after the cleaning, etching of product wafers is not recommenced immediately, but rather an inspection process for inspecting the substrate processing apparatus is first carried out. In particular, an inspection process carried out automatically by the substrate processing apparatus is referred to as an "automatic resetting process" (hereinafter referred to as "auto setup"), and a system is known in which a trigger for executing such auto setup (see, for example, Japanese Laid-open Patent Publication (Kokai) No. 2002-25878) is sent to the substrate processing apparatus from the host once a predetermined operating time has elapsed.

However, with such a substrate processing apparatus, conventionally there has been no communication between the host and the substrate processing apparatus during execution of the auto setup, and hence problems such as the following have arisen.

During the auto setup, inspection wafers different to the product wafers must be transferred into the substrate processing apparatus in accordance with the contents of the inspection of the substrate processing apparatus, but even if the host mistakenly supplies a FOUP housing product wafers to the substrate processing apparatus using the wafer supplying apparatus, the substrate processing apparatus will be unaware of the types of the wafers housed in the supplied FOUP. Product wafers will thus be transferred into the substrate processing apparatus during the auto setup.

Moreover, the contents of the inspection in the auto setup, i.e. the process contents (recipe), are managed by only the substrate processing apparatus, and hence the host is unaware of the contents of the inspection, and thus cannot supply to the substrate processing apparatus a FOUP housing inspection wafers corresponding to the contents of the inspection.

To solve these problems, hitherto it has been the case that operators are stationed at the host and the substrate processing apparatus respectively during the auto setup, and these operators coordinate with one another, deciding on the number and types of inspection wafers to be housed in a FOUP in accordance with the contents of the inspection of the substrate processing apparatus, and checking upon what inspection wafers are actually housed in the FOUP. There has thus been a problem of the execution of the auto setup requiring much operator labor time (man-hours).

SUMMARY OF THE INVENTION

It is an object of the present invention to provide a method of inspecting a substrate processing apparatus, and a storage medium storing an inspection program for executing the method, that enable a reduction in operator labor time to be achieved.

To attain the above object, in a first aspect of the present invention, there is provided a method of inspecting a substrate processing apparatus that communicates with an external controller and executes inspections for predetermined inspection items, the inspection method comprising a prohibit product substrate transfer instruction step of the external controller instructing the substrate processing apparatus to prohibit transfer of a product substrate into the substrate processing apparatus during a period of cleaning the substrate processing apparatus, an inspection substrate notification step of the substrate processing apparatus notifying the external controller of a number and types of inspection substrates to be used in the inspections for the predetermined inspection items, and an inspection substrate preparation complete notification step of the external controller notifying the substrate processing apparatus that preparation of the inspection substrates has been completed.

According to the construction of the first aspect described above, during a period of cleaning the substrate processing apparatus, an instruction to prohibit transfer of a product substrate into the substrate processing apparatus is issued from the external controller to the substrate processing apparatus, the number and types of inspection substrates to be used in the inspections for the predetermined inspection items are notified from the substrate processing apparatus to the external controller, and completion of preparation of the inspection substrates is notified from the external controller to the substrate processing apparatus. As a result, not only is transfer of a product substrate into the substrate processing apparatus prohibited, but moreover the substrate processing apparatus can become aware of the types of the substrates prepared. Transfer of a product substrate into the substrate processing apparatus can thus be reliably prevented. Moreover, the external controller can become aware of the number and types of the inspection substrates, and hence can prepare inspection substrates corresponding to the inspection items. A reduction in operator labor time can thus be achieved.

Preferably, a method of inspecting a substrate processing apparatus further comprises an inspection completed notification step of the substrate processing apparatus notifying the external controller that the inspections for the inspection items have been completed, and a lift product substrate transfer prohibition instruction step of the external controller, in response to the notification that the inspections have been completed, instructing the substrate processing apparatus to lift the prohibition on transfer of a product substrate into the substrate processing apparatus.

According to the construction of the first aspect described above, completion of the inspections for the inspection items is notified from the substrate processing apparatus to the external controller, and in response to the notification of completion of the inspections, an instruction to lift the prohibition on transfer of a product substrate into the substrate processing apparatus is issued from the external controller to the substrate processing apparatus. As a result, after the inspection of the substrate processing apparatus, processing of product substrates can be recommenced automatically, whereby a further reduction in operator labor time can be achieved.

Preferably, a method of inspecting a substrate processing apparatus further comprises a warning notification step of the substrate processing apparatus warning the external controller in response to the preparation of the inspection substrates used in the inspections for the inspection items having not been completed when the inspections are about to be executed.

According to the construction of the first aspect described above, in the case that preparation of the inspection substrates used in the inspections for the inspection items has not been completed when the inspections are about to be executed, a warning is sent from the substrate processing apparatus to the external controller. As a result, the external controller can prepare the inspection substrates in response to the warning, and hence the time for which the substrate processing apparatus waits around can be reduced.

Preferably, a method of inspecting a substrate processing apparatus further comprises an edited inspection item storage step of the substrate processing apparatus storing edited inspection items as the predetermined inspection items.

According to the construction of the first aspect described above, the substrate processing apparatus stores the edited inspection items as the predetermined inspection items. As a result, the edited inspection items can be used in subsequent inspections of the substrate processing apparatus, and hence a further reduction in operator labor time can be achieved.

To attain the above object, in a second aspect of the present invention, there is provided a method of inspecting a substrate processing apparatus that communicates with an external controller and executes inspections for predetermined inspection items, the inspection method comprising a prohibit product substrate transfer step of the substrate processing apparatus prohibiting transfer of a product substrate into the substrate processing apparatus in response to an input to the substrate processing apparatus, an inspection substrate notification step of the substrate processing apparatus notifying the external controller of a number and types of inspection substrates to be used in the inspections for the predetermined inspection items, and an inspection substrate preparation complete notification step of the external controller notifying the substrate processing apparatus that preparation of the inspection substrates has been completed.

According to the construction of the second aspect described above, transfer of a product substrate into the substrate processing apparatus is prohibited in response to an input to the substrate processing apparatus, the number and types of inspection substrates to be used in the inspections for the inspection items are notified from the substrate processing apparatus to the external controller, and completion of preparation of the inspection substrates is notified from the external controller to the substrate processing apparatus. As a result, the substrate processing apparatus can become aware of the types of the substrates prepared. Transfer of a product substrate into the substrate processing apparatus can thus be prevented. Moreover, the external controller can become aware of the number and types of the inspection substrates, and hence can prepare inspection substrates corresponding to the inspection items. A reduction in operator labor time can thus be achieved. Moreover, because transfer of a product substrate into the substrate processing apparatus is prohibited in response to an input to the substrate processing apparatus, the inspections for the predetermined inspection items can be executed at a desired timing, with no increase in operator labor time.

Preferably, a method of inspecting a substrate processing apparatus further comprises a warning notification step of the substrate processing apparatus warning the external controller in response to the preparation of the inspection substrates used in the inspections for the inspection items having not been completed when the inspections are about to be executed.

According to the construction of the second aspect described above, in the case that preparation of the inspection substrates used in the inspections for the inspection items has not been completed when the inspections are about to be executed, a warning is sent from the substrate processing apparatus to the external controller. As a result, the external controller can prepare the inspection substrates in response to the warning, and hence the time for which the substrate processing apparatus waits around can be reduced.

Preferably, a method of inspecting a substrate processing apparatus further comprises an edited inspection item storage step of the substrate processing apparatus storing edited inspection items as the predetermined inspection items.

According to the construction of the second aspect described above, the substrate processing apparatus stores the edited inspection items as the predetermined inspection items. As a result, the edited inspection items can be used in subsequent inspections of the substrate processing apparatus, and hence a further reduction in operator labor time can be achieved.

To attain the above object, in a third aspect of the present invention, there is provided a computer-readable storage medium storing an inspection program for causing a computer to execute a method of inspecting a substrate processing apparatus that communicates with an external controller and executes inspections for predetermined inspection items, the program comprising a prohibit product substrate transfer instruction module for the external controller instructing the substrate processing apparatus to prohibit transfer of a product substrate into the substrate processing apparatus during a period of cleaning the substrate processing apparatus, an inspection substrate notification module for the substrate processing apparatus notifying the external controller of a number and types of inspection substrates to be used in the inspections for the predetermined inspection items, and an inspection substrate preparation complete notification module for the external controller notifying the substrate processing apparatus that preparation of the inspection substrates has been completed.

To attain the above object, in a fourth aspect of the present invention, there is provided a computer-readable storage medium storing an inspection program for causing a computer to execute a method of inspecting a substrate processing apparatus that communicates with an external controller and executes inspections for predetermined inspection items, the program comprising a prohibit product substrate transfer notification module for the substrate processing apparatus notifying the external controller of prohibition of transfer of a product substrate into the substrate processing apparatus in response to an input to the substrate processing apparatus, an inspection substrate notification module for the substrate processing apparatus notifying the external controller of a number and types of inspection substrates to be used in the inspections for the predetermined inspection items, and an inspection substrate preparation complete notification module for the external controller notifying the substrate processing apparatus that preparation of the inspection substrates has been completed.

The above and other objects, features, and advantages of the invention will become more apparent from the following detailed description taken in conjunction with the accompanying drawings.

BRIEF DESCRIPTION OF THE DRAWINGS

FIGS. 2A and 2B are sequence diagram showing the method of inspecting a substrate processing apparatus according to the first embodiment.

FIG. 3 is a diagram showing a display section of an operation controller of a substrate processing apparatus to which is applied a method of inspecting a substrate processing apparatus according to a second embodiment of the present invention;

FIGS. 4A and 4B are sequence diagram showing the method of inspecting a substrate processing apparatus according to the second embodiment.

FIG. 5A is a diagram showing a substrate processing apparatus of a cluster type; and FIG. 5B is a diagram showing a substrate processing apparatus having a double arm-type transfer arm.

DETAILED DESCRIPTION OF THE PREFERRED EMBODIMENTS

The present invention will now be described in detail with reference to the drawings showing preferred embodiments thereof.

First, a description will be given of a method of inspecting a substrate processing apparatus according to a first embodiment of the present invention.

Figure 1:
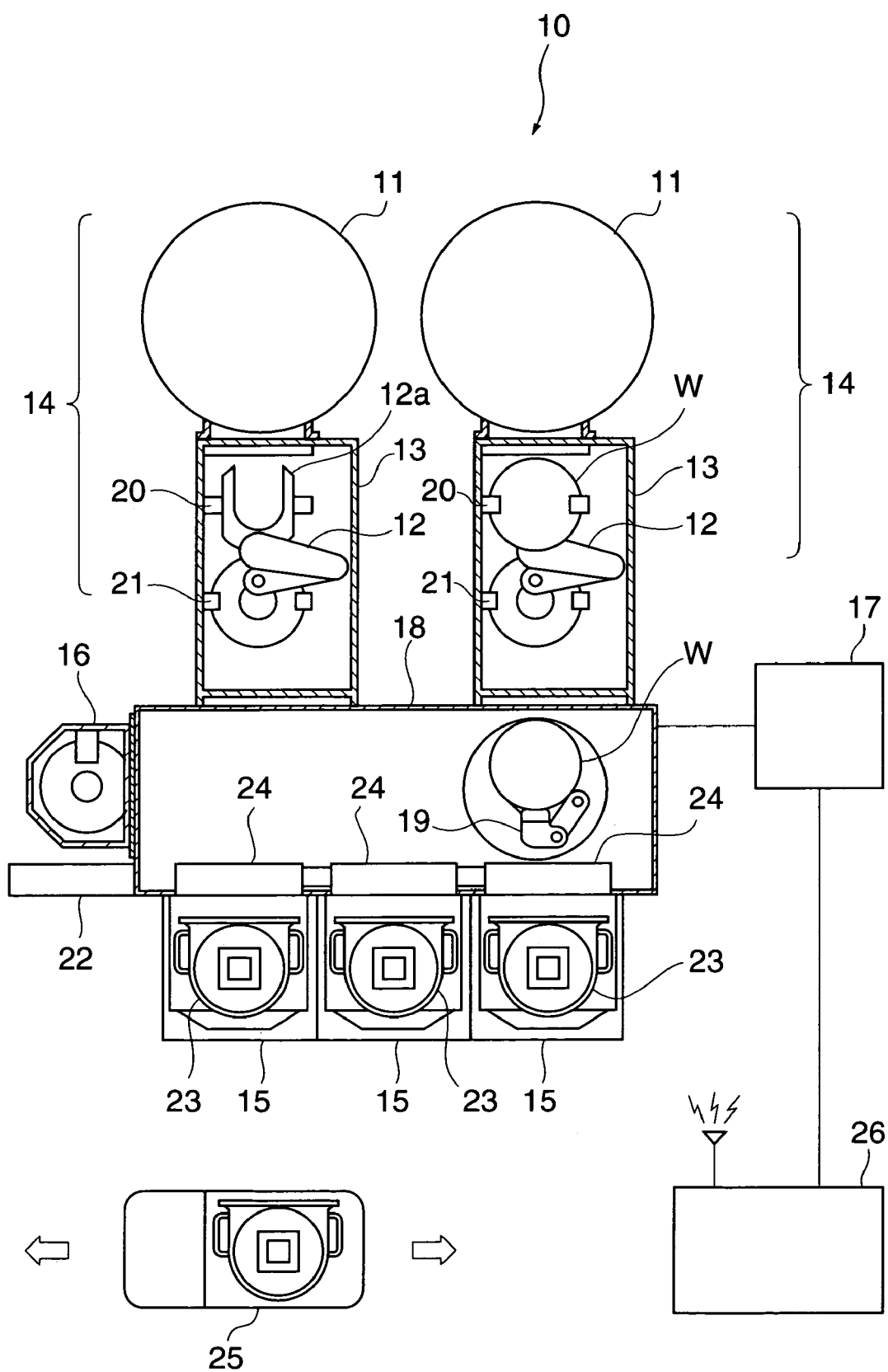
FIG. 1 is a plan view schematically showing the construction of a substrate processing apparatus to which is applied a method of inspecting a substrate processing apparatus according to a first embodiment of the present invention.

FIG. 1 is a plan view schematically showing the construction of a substrate processing apparatus to which is applied the method of inspecting a substrate processing apparatus according to the present embodiment.

As shown in FIG. 1, the substrate processing apparatus 10, which is an etching apparatus, is comprised of two process ships 14 for carrying out processing on wafers W for semiconductor devices (hereinafter referred to as "product wafers W"), three FOUP mounting stages 15 on each of which is mounted a FOUP 23, described below, an orienter 16 that carries out pre-alignment of the position of each product wafer W, and a loader unit 18, which is a rectangular common transfer chamber.

The process ships 14 each have a processing unit 11 as a substrate processing chamber in which etching is carried out on the product wafers W one at a time, and a load lock chamber 13 containing a link-type single pick transfer arm 12 for transferring the product wafers W into and out of the processing unit 11.

In the substrate processing apparatus 10, the two process ships 14, the three FOUP mounting stages 15, and the orienter 16 are detachably connected to the loader unit 18, the process ships 14 being disposed facing the FOUP mounting stages 15 with the loader unit 18 therebetween, and the orienter 16 being disposed at one end of the loader unit 18 in a longitudinal direction of the loader unit 18.

A SCARA-type dual arm transfer arm mechanism 19 for transferring the product wafers W is disposed inside the loader unit 18, and three loading ports 24 through which the product wafers W are introduced into the loader unit 18 are disposed in a side wall of the loader unit 18 in correspondence with the FOUP mounting stages 15. The FOUP 23 is mounted on each FOUP mounting stage 15 such that the FOUP 23 is connected to the corresponding loading port 24.

Each FOUP 23 is a container storing twenty-five product wafers W sealed therein. When a FOUP 23 has been mounted on a FOUP mounting stage 15 and connected to the corresponding loading port 24, the transfer arm mechanism 19 takes a product wafer W out from the FOUP 23 through the loading port 24, and transfers the product wafer W into one of the process ships 14 or the orienter 16. Moreover, the transfer arm mechanism 19 has a mapper (not shown), which is a sensor for identifying the number and arrangement of product wafers W stored in each FOUP 23. When a FOUP 23 has been connected to a loading port 24, identification of the number and arrangement of the product wafers W in the FOUP 23 mounted on the corresponding FOUP mounting stage 15 (i.e. mapping) is thus carried out.

Each processing unit 11 has a cylindrical processing chamber (hereinafter referred to as the "chamber") therein. The chamber has an upper electrode and a lower electrode, the distance between the upper electrode and the lower electrode being set to an appropriate value for carrying out etching on a product wafer W, which is mounted on the lower electrode. Moreover, the lower electrode has in a top portion thereof an ESC (electrostatic chuck) for chucking the product wafer W thereto using a coulomb force or the like.

In each processing unit 11, a processing gas is introduced into the chamber and an electric field is generated between the upper electrode and the lower electrode, whereby the introduced processing gas is activated to generate plasma, which is used for etching the product wafer W.

The internal pressure of the loader unit 18 is held at atmospheric pressure, while the internal pressure of each processing unit 11 is held at vacuum. The load lock chamber 13 of each process ship 14 is thus provided with a vacuum gate valve (not shown) in a connecting part between the load lock chamber 13 and the processing unit 11, and an atmospheric gate valve (not shown) in a connecting part between the load lock chamber 13 and the loader unit 18, whereby the lock chamber 13 is constructed as a preliminary vacuum transfer chamber whose internal pressure can be adjusted.

Within each load lock chamber 13, a transfer arm 12 is disposed in an approximately central portion of the load lock chamber 13, with first buffers 20 being disposed toward the processing unit 11 with respect to the transfer arm 12, and second buffers 21 being disposed toward the loader unit 18 with respect to the transfer arm 12. The first buffers 20 and the second buffers 21 are arranged on a track along which supporting portion (pick) 12a moves, the supporting portion 12a being disposed at the distal end of the transfer arm 12 and being for supporting each product wafer W.

The substrate processing apparatus 10 further includes a control unit 17 for controlling operations of component elements of the substrate processing apparatus 10, and also an operation controller 22 disposed at the end of the loader unit 18 in the longitudinal direction of the loader unit 18.

The control unit 17 is a device comprised, for example, of a CPU, a RAM, and an HDD. The CPU sends control signals to the component elements in accordance with control programs loaded from the HDD into the RAM, thus controlling the operations of the component elements. The operation controller 22 has a display section (not shown) comprised of an LCD (liquid crystal display) for displaying the state of operation of the component elements.

Moreover, the control unit 17 is connected to a host computer (hereinafter simply referred to as the "host") 26 (external controller) that controls operations of the substrate processing apparatus 10 and an AGV (automated guide vehicle) 25, which is a wafer supplying apparatus, described below. The control unit 17 communicates with the host 26 via a communication cable. The AGV 25 is an autonomously controlled transfer robot that transfers FOUPs 23, and communicates with the host 26 by wireless communication.

The host 26 communicates with the substrate processing apparatus 10 and the AGV 25 so as to coordinate operations between the substrate processing apparatus 10 and the AGV 25. In the present embodiment, the host 26 and the substrate processing apparatus 10 communicate with one another not only during semiconductor device manufacture but also during an automatic resetting process of the substrate processing apparatus 10 as described below. The host 26 is thus able to coordinate operations between the substrate processing apparatus 10 and the AGV 25 during the automatic resetting process of the substrate processing apparatus 10.

According to the substrate processing apparatus 10, to carry out etching on a product wafer W, the transfer arm mechanism 19 takes one of the product wafers W out from a FOUP 23 and transfers the product wafer W into the orienter 16, the orienter 16 carries out pre-alignment of the position of the product wafer W, and then the transfer arm mechanism 19 further transfers the product wafer W from the orienter 16 into the load lock chamber 13 of one of the process ships 14.

Next, the transfer arm 12 of the process ship 14 in question receives the product wafer W that has been transferred into the load lock chamber 13, and transfers the product wafer W into the processing unit 11, and then the processing unit 11 carries out etching on the product wafer W. After that, the transfer arm 12 transfers the etched product wafer W out into the load lock chamber 13, where the product wafer W is passed to the transfer arm mechanism 19. Having received the etched product wafer W, the transfer arm mechanism 19 then transfers the product wafer W into the FOUP 23.

According to the substrate processing apparatus 10, after a predetermined operating time has elapsed for one of the processing units 11, a lid of the chamber of the processing unit 11 is opened, and wet cleaning of the interior of the chamber is carried out using alcohol. Moreover, after the wet cleaning, an automatic resetting process (hereinafter referred to as "auto setup") is executed as an inspection process to determine whether or not the substrate processing apparatus 10 operates normally.

In the auto setup, inspections for a plurality of inspection items are carried out in order. The inspection items executed in the auto setup can be categorized into ones that do not use inspection wafers and ones that use inspection wafers.

Examples of inspection items that do not use inspection wafers include a degree of vacuum check, a leakage check, a pressure gauge check, and a flow meter check.

In the degree of vacuum check, the degree of vacuum that can be attained in the chamber of the substrate processing apparatus 10 upon depressurizing the chamber is inspected. In the leakage check, it is inspected whether or not leakage of air or the like into the chamber occurs when the chamber has been depressurized. In the pressure gauge check, the zero point and sensitivity of a pressure gauge in the chamber are inspected. In the flow meter check, the zero point and flow rate stability of a flow meter of a FCS (flow control system) that supplies the processing gas into the chamber are inspected.

Examples of inspection items that use inspection wafers include seasoning, a particle check, an etching rate check, and test processing.

In seasoning, predetermined processing is carried out on a plurality of inspection wafers using the processing unit 11, whereby it is inspected whether or not the atmosphere in the chamber has stabilized so as to conform to predetermined conditions suitable for etching. In the particle check, the amount of particles that become attached to an inspection wafer upon transferring the inspection wafer inside the substrate processing apparatus 10 is inspected. In the etching rate check, the etching rate for etching of an inspection wafer in the processing unit 11 is inspected. In the test processing, after the seasoning, the particle check and the etching rate check have been completed, etching is carried out on an inspection wafer under the same processing conditions as for a product wafer W, whereby it is inspected whether or not a desired quality can be obtained.

The inspection wafers used in the seasoning, the particle check, the etching rate check and the test processing are of different types to one another, and hence an inspection wafer used for a given inspection item cannot be used for another inspection item. In the auto setup, it is thus necessary to manage the inspection wafers so as to correspond to the inspection items.

In the auto setup, it is not necessary to execute all of the above inspection items, but rather the inspection items executed may be changed in accordance with the state of the substrate processing apparatus 10, for example the types of components in the chamber replaced during the wet cleaning.

In the substrate processing apparatus 10, the HDD of the control unit 17 stores a plurality of auto setup recipes (sets of processing conditions) according to which different inspection items are executed. Before the auto setup is executed, an operator selects a desired auto setup recipe using the operation controller 22. Moreover, an auto setup recipe can also be edited using the operation controller 22, specifically the operator can edit the auto setup recipe by adding/deleting inspection items using the operation controller 22. After being edited by the operator, the auto setup recipe is stored in the HDD of the control unit 17 (edited inspection item storage step).

Figure 2B:
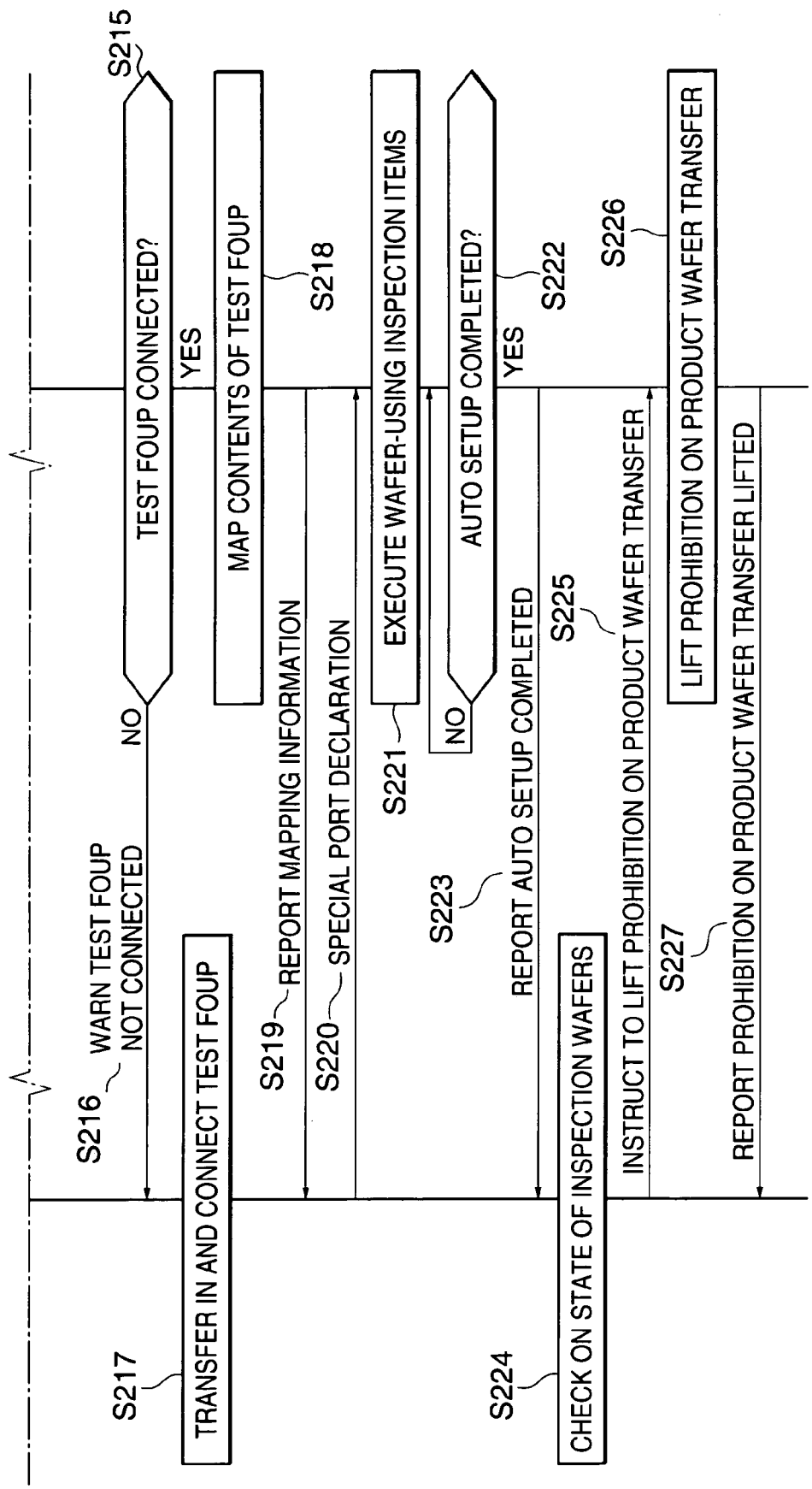

FIGS. 2A and 2B are sequence diagram showing the method of inspecting a substrate processing apparatus according to the present embodiment.

First, the host 26 determines whether or not the cumulative operating time of the substrate processing apparatus 10 corresponds to a predetermined wet cleaning required period for the chamber of one of the processing units 11. In the case that it is determined that the cumulative operating time does correspond to the wet cleaning required period, i.e. in the case that it is identified that a wet cleaning commencement time for the chamber has been reached (S201), the host 26 sends to the substrate processing apparatus 10 a prohibit transfer trigger that instructs the substrate processing apparatus 10 to prohibit transfer of a product wafer W into the processing unit 11 having the chamber for which it has been identified that the wet cleaning commencement time has been reached (hereinafter referred to as the "targeted processing unit") (S202) (prohibit product substrate transfer instruction step).

In step S201, instead of the host 26, an operator may determine whether or not the operating time for the substrate processing apparatus 10 corresponds to the predetermined wet cleaning required period for a chamber, in which case if the operator finds that the wet cleaning commencement time for the chamber has been reached, then the operator causes the host 26 to send the prohibit transfer trigger to the substrate processing apparatus 10.

The prohibit transfer trigger includes information on an instruction for the substrate processing apparatus 10 to automatically release the chamber to atmospheric pressure so that the lid of the chamber can be opened. Moreover, the prohibit transfer trigger may also include information instructing that the substrate processing apparatus 10 may automatically lift the prohibition on transfer of a product wafer W into the targeted processing unit after the execution of the auto setup has been completed.

Upon receiving the prohibit transfer trigger, the substrate processing apparatus 10 shifts into a mode in which transfer of a product wafer W into the targeted processing unit is prohibited (S203), and reports to the host 26 that transfer of a product wafer W into the targeted processing unit has been prohibited (S204). At this time, the substrate processing apparatus 10 may also send to the host 26 a warning for operators that transfer of a product wafer W is prohibited.

Upon receiving the report from the substrate processing apparatus 10 that transfer of a product wafer W into the targeted processing unit has been prohibited, the host 26 discontinues transfer of new FOUPs 23 storing product wafers W to the substrate processing apparatus 10 by the AGV 25 (S205).

After that, the substrate processing apparatus 10 determines whether or not all etched product wafers W have been transferred out from the targeted processing unit (S206). In the case that there is a product wafer W that has not yet been transferred out, etching of that product wafer W is continued, and in the case that all product wafers W have been transferred out, the targeted processing unit is shifted into a maintenance mode, and the chamber thereof is released to atmospheric pressure so that the lid of the chamber can be opened (S207), and then the substrate processing apparatus 10 reports to the host 26 that the chamber has been released to atmospheric pressure (S208). Moreover, to release the chamber to atmospheric pressure, the temperature in the chamber must be adjusted to room temperature in advance, and hence it may be made to be such that before reporting that the chamber has been released to atmospheric pressure, once the temperature in the chamber has been changed to reach room temperature, the substrate processing apparatus 10 reports to the host 26 that the temperature in the chamber has reached room temperature, thus notifying the operator of the host 26 that the chamber is just about to be released to atmospheric pressure.

Next, in the substrate processing apparatus 10, wet cleaning is carried out in the chamber of the targeted processing unit (S209), and then the contents of an auto setup recipe selected or edited by the operator of the substrate processing apparatus 10 are identified, and the number and types of inspection wafers corresponding to inspection items that use inspection wafers (hereinafter referred to as "wafer-using inspection items") in the auto setup are identified (S210).

After that, the substrate processing apparatus 10 reports to the host 26 that execution of the auto setup is to be commenced (S211), and furthermore requests the host 26 to transfer in a FOUP 23 (hereinafter referred to as the "test FOUP") in which are stored the number and types of inspection wafers corresponding to the wafer-using inspection items (S212) (inspection substrate notification step). The substrate processing apparatus 10 then commences execution of the auto setup (S213). Upon receiving the request to transfer in the test FOUP, the host 26 prepares the test FOUP, and then uses the AGV 25 to transfer the test FOUP in, mounts the test FOUP on one of the FOUP mounting stages 15 of the substrate processing apparatus 10, and connects the test FOUP to the corresponding loading port 24.

In the auto setup, first, the substrate processing apparatus 10 executes inspections for the inspection items that do not use inspection wafers (S214), and then before executing the inspections for the wafer-using inspection items, determines whether or not the test FOUP has been connected to the loading port 24 (S215). The reason that the substrate processing apparatus 10 checks on state of connection of the test FOUP to the loading port 24 before executing the inspections for the wafer-using inspection items is that it takes time for the host 26 to prepare the test FOUP, and hence the connection of the test FOUP may not be carried out in time for the execution of the inspections for the wafer-using inspection items.

In the case that it is determined in step S215 that the test FOUP has not been connected to the loading port 24, the substrate processing apparatus 10 sends a test FOUP not connected warning to the host 26 indicating that the test FOUP has not been connected to the loading port 24, and temporarily suspends execution of the auto setup (S216) (warning notification step).

Upon receiving the test FOUP not connected warning, the host 26 prepares the test FOUP, and uses the AGV 25 to transfer the test FOUP in, mounts the test FOUP on one of the FOUP mounting stages 15 of the substrate processing apparatus 10, and connect the test FOUP to the corresponding loading port 24 (S217).

Once the substrate processing apparatus 10 has detected that the test FOUP has been connected to the loading port 24, mapping of the inspection wafers in the test FOUP is carried out by the mapper (S218), and because the substrate processing apparatus 10 is unaware of the types of the inspection wafers in the test FOUP, the substrate processing apparatus 10 reports to the host 26 mapping information indicating the number and arrangement of the wafers in the test FOUP as obtained through the mapping (S219), and requests the host 26 to send information on the types of the inspection wafers in the test FOUP.

Upon receiving the report of the mapping information, the host 26 sends to the substrate processing apparatus 10 information on the types of the inspection wafers stored in the test FOUP connected to the loading port 24, the targeted processing unit into which the inspection wafers are to be transferred and the like, as a special port declaration (S220). As a result, the host 26 notifies the substrate processing apparatus 10 that preparation of the inspection wafers has been completed (inspection substrate preparation complete notification step).

Above steps S218 to S220 are not only executed after connection of the test FOUP (S217) in response to the host 26 receiving a test FOUP not connected warning, but are also executed in the case that the test FOUP has been connected to the loading port 24 in response to the host 26 receiving the request to transfer in the test FOUP (S212) without it being necessary for the host 26 to receive such a test FOUP not connected warning.

Upon receiving the special port declaration, the substrate processing apparatus 10 stops sending the test FOUP not connected warning, and executes the inspections for the wafer-using inspection items (S221).

Next, the substrate processing apparatus 10 determines whether or not execution of the inspections for the wafer-using inspection items, and hence execution of the auto setup, has been completed (S222), and in the case that execution of the inspections for the wafer-using inspection items has not been completed, continues execution of the auto setup, whereas in the case that execution of the inspections for the wafer-using inspection items has been completed, reports to the host 26 that execution of the auto setup has been completed (S223) (inspection completed notification step).

Upon receiving the report that execution of the auto setup has been completed, the host 26 recovers the test FOUP housing the inspection wafers that have been processed in accordance with the respective items in the inspections for the wafer-using inspection items, and causes a measuring apparatus (not shown) disposed separately to the substrate processing apparatus 10 to check on the state of the inspection wafers in the recovered test FOUP (S224). As a result, the host 26 determines whether or not the substrate processing apparatus 10 has been reset normally.

In the case that it is determined that the substrate processing apparatus 10 has been reset normally, the host 26 sends a lift transfer prohibition trigger instructing lifting of the prohibition on transfer of a product wafer W into the targeted processing unit (S225) (lift product substrate transfer prohibition instruction step).

Upon receiving the lift transfer prohibition trigger, the substrate processing apparatus 10 lifts the prohibition on transfer of a product wafer W into the targeted processing unit, shifts into an idle state of awaiting receipt of a product wafer W (S226), and reports to the host 26 that the prohibition on transfer of a product wafer W into the targeted processing unit has been lifted (S227). At this time, if the substrate processing apparatus 10 has been sending the host 26 a warning for operators that transfer in of a product wafer W is prohibited, then the substrate processing apparatus 10 stops sending this warning.

According to the method of inspecting a substrate processing apparatus of the present embodiment, when it is determined that the cumulative operating time of the substrate processing apparatus 10 corresponds to the wet cleaning required period, a prohibit transfer trigger that instructs transfer of a product wafer W into the targeted processing unit to be prohibited is sent from the host 26 to the substrate processing apparatus 10 (S202). Then, upon the contents of the auto setup recipe being identified and the number and types of inspection wafers corresponding to the wafer-using inspection items being identified, a request to transfer in a test FOUP is sent from the substrate processing apparatus 10 to the host 26 (S212). Then, upon mapping information for the test FOUP connected to the loading port 24 being reported from the substrate processing apparatus 10 to the host 26, information on the types of the inspection wafers stored in the test FOUP, the targeted processing unit into which the inspection wafers are to be transferred and the like, as a special port declaration, is sent to the substrate processing apparatus 10 (S220).

As a result, not only is transfer of a product wafer W into the targeted processing unit prohibited, but moreover the substrate processing apparatus 10 can become aware of the types of the inspection wafers stored in the test FOUP. Transfer of a product wafer W into the targeted processing unit can thus be reliably prevented. Moreover, the host 26 can become aware of the number and types of inspection wafers corresponding to the wafer-using inspection items, and hence can prepare a test FOUP storing inspection wafers corresponding to the wafer-using inspection items.

There is thus no need for the operator of the host 26 and the operator of the substrate processing apparatus 10 to coordinate with one another, and hence a reduction in operator labor time can be achieved, and moreover the substrate processing apparatus 10 can be prevented from waiting around due to a test FOUP having not been connected to the loading port 24.

According to the method of inspecting a substrate processing apparatus of the present embodiment described above, it is reported from the substrate processing apparatus 10 to the host 26 that execution of the auto setup has been completed (S223), and in response to the report that execution of the auto setup has been completed, a lift transfer prohibition trigger instructing lifting of the prohibition on transfer of a product wafer W into the targeted processing unit is sent from the host 26 to the substrate processing apparatus 10 (S225). As a result, after the execution of the auto setup of the substrate processing apparatus 10, the substrate processing apparatus 10 shifts into an idle state of awaiting receipt of a product wafer W, and hence etching of product wafers W can be recommenced automatically, whereby a further reduction in operator labor time can be achieved.

Moreover, according to the method of inspecting a substrate processing apparatus of the present embodiment described above, during the execution of the auto setup, if a test FOUP has not been connected to the loading port 24 in time for execution of the inspections for the wafer-using inspection items, then a test FOUP not connected warning indicating that the test FOUP has not been connected to the loading port 24 is sent from the substrate processing apparatus 10 to the host 26 (S216). As a result, the host 26 can prepare a test FOUP in response to the test FOUP not connected warning, and hence the time for which the substrate processing apparatus 10 waits around can be further reduced.

Moreover, according to the substrate processing apparatus 10 described above, an auto setup recipe edited by an operator is stored in the HDD of the control unit 17. As a result, the stored edited auto setup recipe can be used in subsequent auto setups, and hence a further reduction in operator labor time can be achieved.

According to the method of inspecting a substrate processing apparatus of the present embodiment described above, the substrate processing apparatus 10 lifts the prohibition on transfer of a product wafer W into the targeted processing unit upon receiving the lift transfer prohibition trigger. However, in the case that in step S202, the prohibit transfer trigger includes information instructing that the substrate processing apparatus 10 may automatically lift the prohibition on transfer of a product wafer W into the targeted processing unit upon execution of the auto setup being completed, the substrate processing apparatus 10 may automatically lift the prohibition on transfer of a product wafer W into the targeted processing unit after reporting to the host 26 that the execution of the auto setup has been completed.

Figure 6:
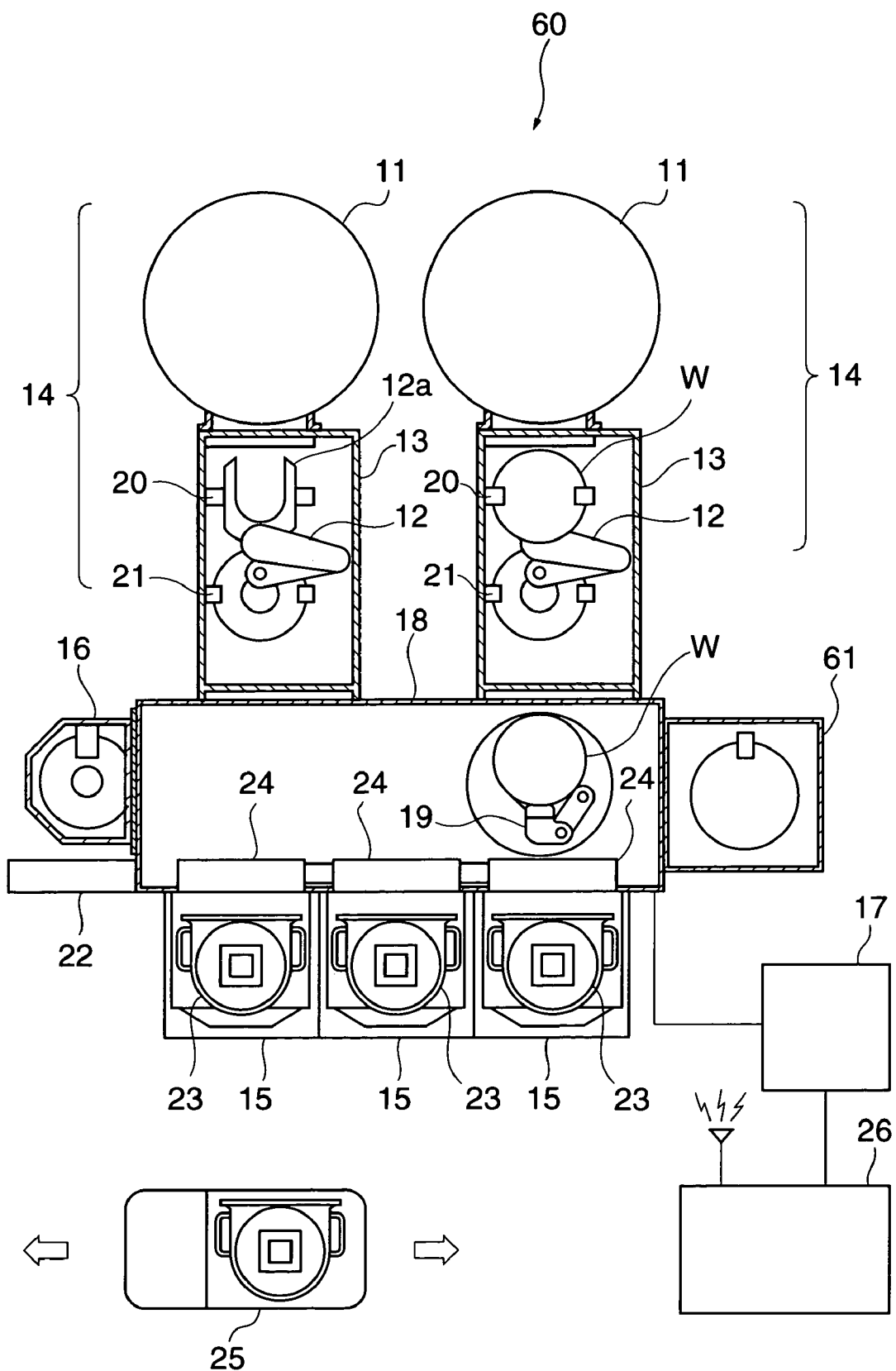
FIG. 6 is a plan view schematically showing the construction of a variation of the substrate processing apparatus to which is applied the method of inspecting a substrate processing apparatus according to the first embodiment.

Moreover, according to the method of inspecting a substrate processing apparatus of the present embodiment described above, the host 26 recovers the test FOUP housing the inspection wafers, and then causes a measuring apparatus disposed separately to the substrate processing apparatus 10 to check on the state of the inspection wafers in the recovered test FOUP. However, as shown in FIG. 6, it may be made to be such that the substrate processing apparatus 60 has a measuring apparatus, for example an IMS (Integrated Metrology System, made by Therma-Wave, Inc.) 61, the substrate processing apparatus 60 measures the state of the processed inspection wafers in the targeted processing unit using the IMS 61 and sends the measurement results to the host 26, and then the host 26 determines whether or not the substrate processing apparatus 60 has been reset normally based on the measurement results. As a result, the need to recover the test FOUP is eliminated, and hence etching of product wafers W can be recommenced rapidly after the auto setup.

Furthermore, according to the method of inspecting a substrate processing apparatus of the present embodiment, the host 26 monitors the cumulative operating time of the substrate processing apparatus 10, and compares the cumulative operating time with the wet cleaning required period to determine when to send the prohibit transfer trigger to the substrate processing apparatus 10. However, the item monitored by the host 26 is not limited to the cumulative operating time, but rather may be, for example, the cumulative duration of electrical discharge in the processing unit 11, the cumulative number of times of carrying out etching in the processing unit 11, or the cumulative amount of the processing gas used.

Next, a description will be given of a method of inspecting a substrate processing apparatus according to a second embodiment of the present invention.

The present embodiment is basically the same as the above first embodiment in terms of construction and operation, but differs from the above first embodiment in that execution of the auto setup is commenced at a timing chosen by an operator, and wet cleaning is not carried out in the chamber of the processing unit 11.

Description of features of the construction and operation that are the same as in the first embodiment will thus be omitted here, with only features of the construction and operation that are different to in the first embodiment being described.

FIG. 3 is a diagram showing a display section of an operation controller of a substrate processing apparatus to which is applied the method of inspecting a substrate processing apparatus according to the present embodiment.

As shown in FIG. 3, the display section 27 of the operation controller 22 displays a schematic model of the substrate processing apparatus 10. Moreover, the display section 27 has a touch panel capability, whereby if an operator touches a portion of the display section 27 corresponding to a component element of the displayed model, then a sub-window corresponding to this component element, for example a pop-up window 28, is displayed. The sub-window displays the state of operation of the corresponding component element, and further displays a menu relating to operations of the component element.

The operator can operate the component element by selecting a desired operating method from the displayed menu. For example, in the pop-up window 28 corresponding to a processing unit 11, there are displayed a "normal" button 29 for inputting an instruction to execute a normal processing of etching product wafers W, and an "auto setup" button 30 for inputting an instruction to execute auto setup of the processing unit 11. The operator can cause the substrate processing apparatus 10 to execute the desired process by pressing the corresponding button.

Moreover, the pop-up window 28 has a recipe display section 31 in which is displayed a list of recipes for the normal processing or the auto setup. The recipe display section 31 displays a list of recipes for the normal processing or the auto setup in accordance with the operator's selection of the button 29 or 30. The operator can select a desired recipe from the list of recipes displayed on the recipe display section 31 so as to set a process recipe, e.g. an auto setup recipe, for the substrate processing apparatus 10.

Moreover, in the recipe display section 31, if a desired recipe in the displayed list of recipes is double clicked, then a recipe editing pop-up window 32 showing a list of the process items in the desired recipe, e.g. the inspection items in the case of an auto setup recipe, is displayed. The operator can edit the recipe in the recipe editing pop-up window 32 by deleting inspection items and/or adding new inspection items. The edited recipe can then be set as the process recipe for the substrate processing apparatus 10, and moreover can be stored in the HDD of the control unit 17 by the operator pressing a "save" button (not shown) (edited inspection item storage step).

In the present embodiment, in the case that a processing unit 11 is in an idle state, if the operator presses the "auto setup" button 30, then even if the cumulative operating time of the substrate processing apparatus 10 has not yet reached the predetermined wet cleaning required period for the chamber, the substrate processing apparatus 10 executes the method of inspecting a substrate processing apparatus according to the present embodiment as described below.

Figure 4B:
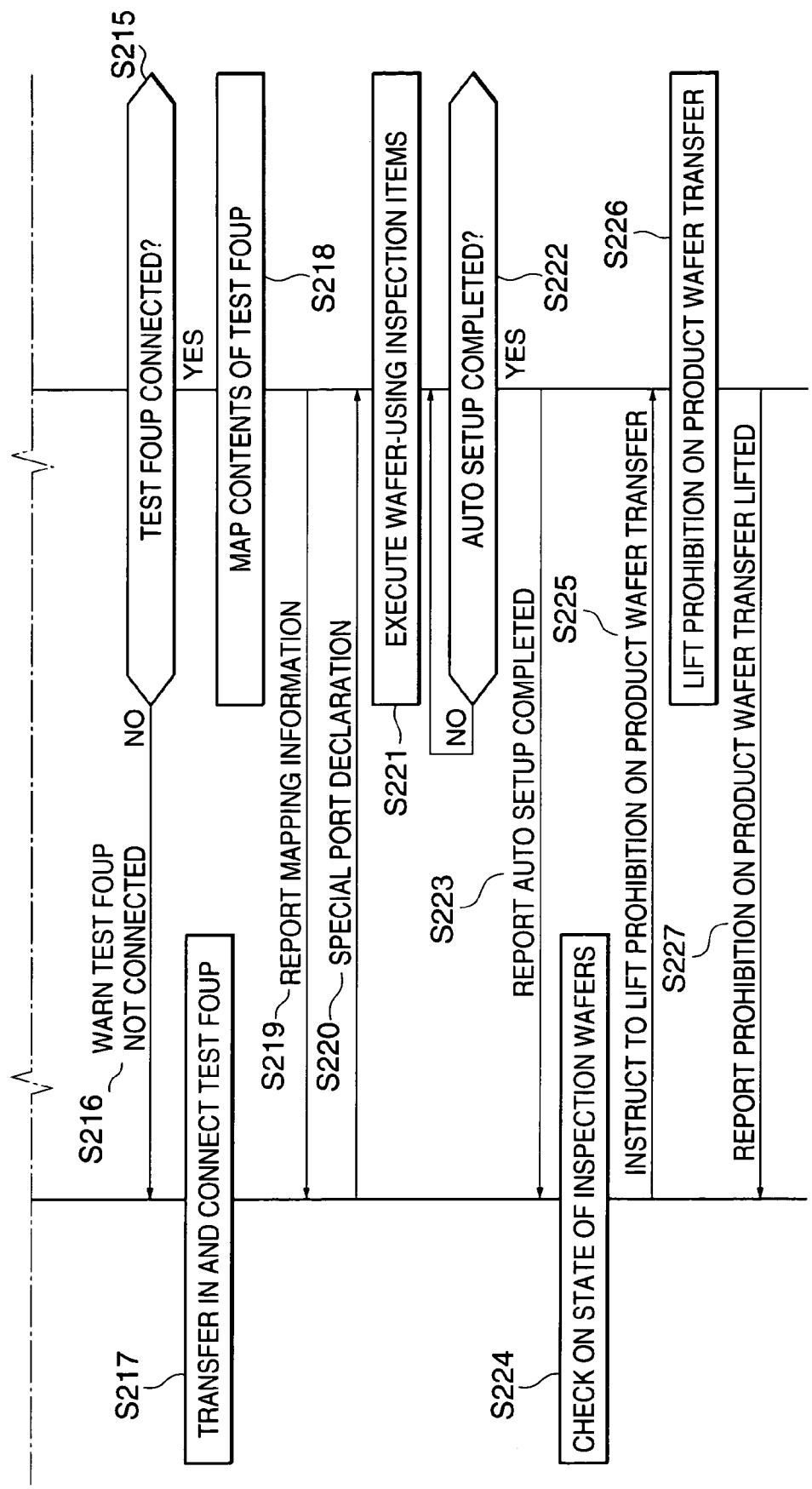

FIGS. 4A and 4B are sequence diagram showing the method of inspecting a substrate processing apparatus according to the present embodiment.

First, the operator presses the "auto setup" button 30 in the display section 27, thus inputting an instruction to the substrate processing apparatus 10 to commence execution of auto setup (S401), whereupon the substrate processing apparatus 10 shifts into a maintenance mode in which transfer of a product wafer W into the targeted processing unit is prohibited (S402) (prohibit product substrate transfer step), and further executes steps S204 and S206 shown in FIG. 2A. Moreover, at this time, the host 26 executes step S205 shown in FIG. 2A.

Next, the operator selects a desired auto setup recipe, or edits an auto setup recipe, using the recipe display section 31 of the display section 27, and sets the selected or edited auto setup recipe as the process recipe, whereupon the contents of the auto setup recipe are identified, and the number and types of inspection wafers corresponding to the wafer-using inspection items in the auto setup are identified (S210).

After that, the substrate processing apparatus 10 and the host 26 execute steps S211 to S227 shown in FIG. 2B.

According to the method of inspecting a substrate processing apparatus of the present embodiment, in response to the operator inputting an instruction to the substrate processing apparatus 10 to commence execution of the auto setup, transfer of a product wafer W into the targeted processing unit is prohibited (S402). Then, upon the contents of the auto setup recipe being identified and the number and types of inspection wafers corresponding to the wafer-using inspection items being identified, a request to transfer in a test FOUP is sent from the substrate processing apparatus 10 to the host 26 (S212). Then, upon mapping information for the test FOUP connected to the loading port 24 being reported from the substrate processing apparatus 10 to the host 26, information on the types of the inspection wafers stored in the test FOUP, the targeted processing unit into which the inspection wafers are to be transferred and the like, as a special port declaration, is sent to the substrate processing apparatus 10 (S220).

As a result, the substrate processing apparatus 10 can become aware of the types of the inspection wafers stored in the test FOUP. Transfer of a product wafer W into the targeted processing unit can thus be reliably prevented. Moreover, the host 26 can become aware of the number and types of inspection wafers corresponding to the wafer-using inspection items, and hence can prepare a test FOUP storing inspection wafers corresponding to the wafer-using inspection items. There is thus no need for the operator of the host 26 and the operator of the substrate processing apparatus 10 to coordinate with one another, and hence a reduction in operator labor time can be achieved, and moreover the substrate processing apparatus 10 can be prevented from waiting around due to a test FOUP having not been connected to the loading port 24.

Moreover, in response to an instruction to commence execution of the auto setup being inputted to the substrate processing apparatus 10, transfer of a product wafer W into the targeted processing unit is forbidden (S402), and then the auto setup is executed. As a result, the auto setup can be executed at a timing chosen by an operator, with no increase in operator labor time. The operator can thus readily use the auto setup in periodic inspections, for example daily inspections, of the substrate processing apparatus 10.

In the method of inspecting a substrate processing apparatus according to each of the embodiments described above, the host 26 and the substrate processing apparatus 10 communicate with one another. However, each of the above embodiments may instead be realized through an external server that controls the operations of the substrate processing apparatus 10 being provided instead of the host 26, and the external server and the substrate processing apparatus 10 communicating with one another.

In the method of inspecting a substrate processing apparatus according to each of the embodiments described above, inspection of a processing unit 11 of the substrate processing apparatus 10 is carried out by transferring inspection wafers into the chamber of the processing unit 11. However, inspection of the state of a transfer system comprised of a load lock chamber 13 and the loader unit 18 may also be carried out by transferring an inspection wafer inside only the load lock chamber 13 and/or the loader unit 18 and measuring, for example, the amount of particles that become attached to the inspection wafer.

In the method of inspecting a substrate processing apparatus according to each of the embodiments described above, a FOUP 23 is used as a container for the inspection wafers. However, another container able to house wafers sealed therein may be used instead.

Figure 5A:
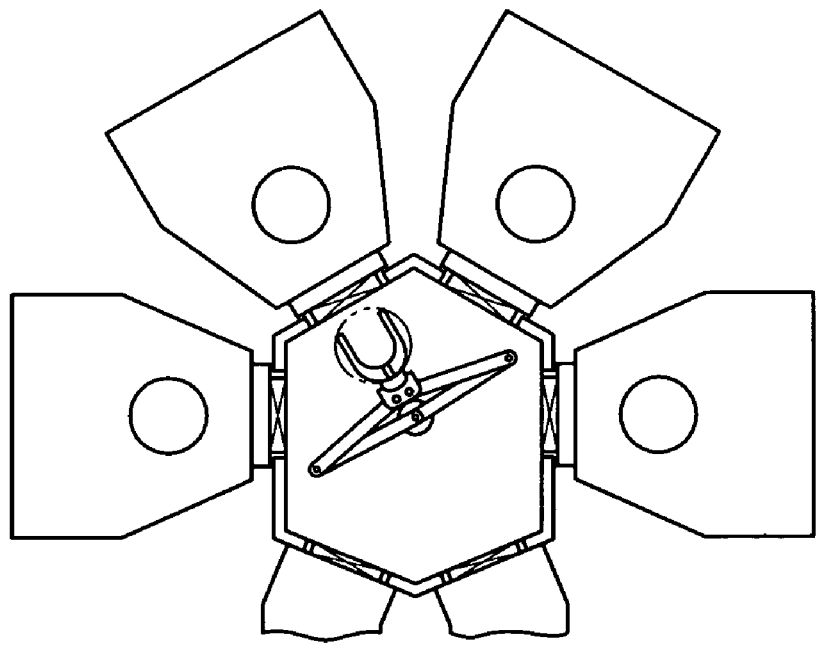
FIGS. 5A and 5B are plan views schematically showing the constructions of other substrate processing apparatuses to which are applied the methods of inspecting a substrate processing apparatus according to the first and second embodiments of the present invention; specifically.
Figure 5B:
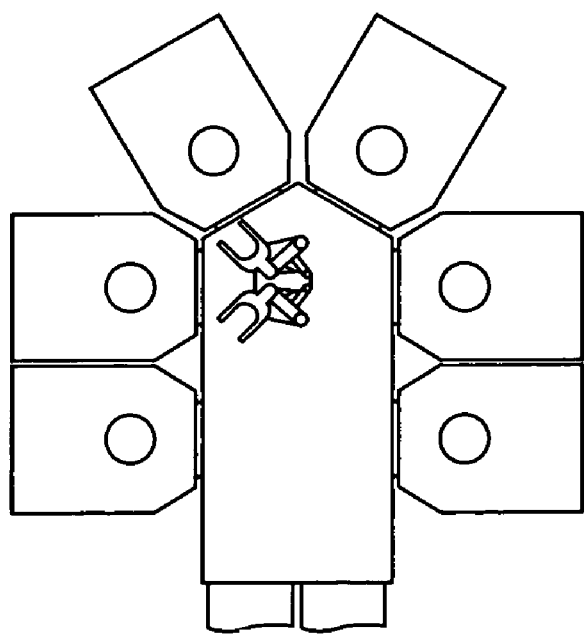

Moreover, the substrate processing apparatus to which the method of inspecting a substrate processing apparatus according to each of the embodiments described above is applied is not limited to being a substrate processing apparatus of a parallel type having two process ships 14 arranged in parallel with one another as shown in FIG. 1, but rather as shown in FIGS. 5A and 5B, the substrate processing apparatus may instead be of a substrate processing apparatus of a cluster type having a plurality of processing units arranged in an approximately radial manner around a transfer chamber provided with a frog leg-type transfer arm for transfer of product wafers W (FIG. 5A), or a substrate processing apparatus having a transfer chamber provided with a double arm-type transfer arm comprised of two SCARA-type transfer arms, and a plurality of processing units arranged such as to surround the transfer chamber (FIG. 5B). It is to be understood that similarly to the substrate processing apparatus shown in FIG. 1, each of the substrate processing apparatuses shown in FIGS. 5A and 5B also includes FOUP mounting stages 15, an orienter 16, a loader unit 18, and an operation controller 22.

Furthermore, in the embodiments described above, the substrates to be processed are wafers for semiconductor devices. However, the substrates to be processed are not limited thereto, but rather may be, for example, glass substrates for LCDs, FPDs (flat panel displays), or the like.

It is to be understood that the object of the present invention can also be attained by supplying to a system or apparatus (the control unit 17 or the host 26) a storage medium storing program code of software that realizes the functions of an embodiment as described above, and then causing a computer (or CPU, MPU, or the like) of the system or apparatus to read out and execute the program code stored in the storage medium.

In this case, the program code itself read out from the storage medium realizes the functions of the embodiment, and hence the program code and the storage medium storing the program code constitute the present invention.

The storage medium for supplying the program code may be, for example, a floppy (registered trademark) disk, a hard disk, a magnetic-optical disk, an optical disk such as a CD-ROM, a CD-R, a CD-RW, a DVD-ROM, a DVD-RAM, a DVD-RW, or a DVD+RW, a magnetic tape, a nonvolatile memory card, or a ROM. Alternatively, the program code may be downloaded via a network.

Moreover, it is to be understood that the functions of each of the embodiments described above, can be realized not only by executing program code read out by the computer, but also by causing an OS (operating system) or the like operating on the computer to carry out part or all of the actual processing based on instructions of the program code.

Furthermore, it is to be understood that the functions of the embodiment can also be realized by writing the program code read out from the storage medium into a memory provided on an expansion board inserted into the computer or in an expansion unit connected to the computer, and then causing a CPU or the like provided on the expansion board or in the expansion unit to carry out part or all of the actual processing based on instructions of the program code.

The form of the program code may be, for example, object code, program code executed by an interpreter, or script data supplied to an OS.

What is claimed is:

1. A method of inspecting a substrate processing apparatus that communicates with an external controller and executes inspections for predetermined inspection items, the inspection method comprising:
   a prohibit product substrate transfer instruction step of the external controller instructing the substrate processing apparatus to prohibit transfer of a product substrate into the substrate processing apparatus during a period of cleaning the substrate processing apparatus;
   an inspection substrate notification step of the substrate processing apparatus notifying the external controller of a number and types of inspection substrates to be used in the inspections for the predetermined inspection items; and
   an inspection substrate preparation complete notification step of the external controller notifying the substrate processing apparatus that preparation of the inspection substrates has been completed.

2. A method of inspecting a substrate processing apparatus as claimed in claim 1, further comprising:
   an inspection completed notification step of the substrate processing apparatus notifying the external controller that the inspections for the inspection items have been completed; and
   a lift product substrate transfer prohibition instruction step of the external controller, in response to the notification that the inspections have been completed, instructing the substrate processing apparatus to lift the prohibition on transfer of a product substrate into the substrate processing apparatus.

3. A method of inspecting a substrate processing apparatus as claimed in claim 1, further comprising:
   a warning notification step of the substrate processing apparatus warning the external controller in response to the preparation of the inspection substrates used in the inspections for the inspection items having not been completed when the inspections are about to be executed.

4. A method of inspecting a substrate processing apparatus as claimed in claim 1, further comprising:
   an edited inspection item storage step of the substrate processing apparatus storing edited inspection items as the predetermined inspection items.

5. A method of inspecting a substrate processing apparatus that communicates with an external controller and executes inspections for predetermined inspection items, the inspection method comprising:
   a prohibit product substrate transfer step of the substrate processing apparatus prohibiting transfer of a product substrate into the substrate processing apparatus in response to an input to the substrate processing apparatus;
   an inspection substrate notification step of the substrate processing apparatus notifying the external controller of a number and types of inspection substrates to be used in the inspections for the predetermined inspection items; and
   an inspection substrate preparation complete notification step of the external controller notifying the substrate processing apparatus that preparation of the inspection substrates has been completed.

6. A method of inspecting a substrate processing apparatus as claimed in claim 5, further comprising:
   a warning notification step of the substrate processing apparatus warning the external controller in response to the preparation of the inspection substrates used in the inspections for the inspection items having not been completed when the inspections are about to be executed.

7. A method of inspecting a substrate processing apparatus as claimed in claim 5, further comprising:
   an edited inspection item storage step of the substrate processing apparatus storing edited inspection items as the predetermined inspection items.

8. A computer-readable storage medium storing an inspection program for causing a computer to execute a method of inspecting a substrate processing apparatus that communicates with an external controller and executes inspections for predetermined inspection items, the program comprising:
   a prohibit product substrate transfer instruction module for the external controller instructing the substrate processing apparatus to prohibit transfer of a product substrate into the substrate processing apparatus during a period of cleaning the substrate processing apparatus;
   an inspection substrate notification module for the substrate processing apparatus notifying the external controller of a number and types of inspection substrates to be used in the inspections for the predetermined inspection items; and
   an inspection substrate preparation complete notification module for the external controller notifying the substrate processing apparatus that preparation of the inspection substrates has been completed.

9. A computer-readable storage medium storing an inspection program for causing a computer to execute a method of inspecting a substrate processing apparatus that communicates with an external controller and executes inspections for predetermined inspection items, the program comprising:
   a prohibit product substrate transfer notification module for the substrate processing apparatus notifying the external controller of prohibition of transfer of a product substrate into the substrate processing apparatus in response to an input to the substrate processing apparatus;
   an inspection substrate notification module for the substrate processing apparatus notifying the external controller of a number and types of inspection substrates to be used in the inspections for the predetermined inspection items; and
   an inspection substrate preparation complete notification module for the external controller notifying the substrate processing apparatus that preparation of the inspection substrates has been completed.

* * * * *